United States Patent [19]

Shahamat

[11] Patent Number: 4,987,328

[45] Date of Patent: Jan. 22, 1991

[54] ROTATING RECTIFIER IN BRAZED ASSEMBLY

[75] Inventor: Mohammad Shahamat, Rockford, Ill.

[73] Assignee: Sundstrand Corporation, Rockford, Ill.

[21] Appl. No.: 473,413

[22] Filed: Feb. 1, 1990

[51] Int. Cl.⁵ .............................................. H02K 11/00
[52] U.S. Cl. .................................... 310/68 D; 310/42
[58] Field of Search .................. 310/54, 64, 68 D, 42; 29/598

[56] References Cited

U.S. PATENT DOCUMENTS

| | | |
|---|---|---|
| 3,979,659 | 9/1976 | Lynch, Jr. et al. ............... 310/68 D |
| 4,329,603 | 5/1982 | Ballard .................... 310/64 |
| 4,570,094 | 2/1986 | Trommer ......................... 310/68 D |
| 4,621,210 | 11/1986 | Krinickas, Jr. . |
| 4,628,219 | 12/1986 | Troscinski . |

Primary Examiner—Steven L. Stephan
Assistant Examiner—D. L. Rebsch
Attorney, Agent, or Firm—Wood, Phillips, Mason, Recktenwald & VanSanten

[57] ABSTRACT

The problem of assembling and maintaining good electrical contact in a rotating rectifier assembly (40) is solved using brazed connections. The rectifier assembly (40) includes three planar, tear-shaped copper phase plates (62) which are equally angularly spaced about an axis (68) in a cylindrical housing (44). Six diode wafers (70) are arranged in two parallel planes which are perpendicular to the axis (68). Three diodes (70) in each plane are brazed (72) to one of the oppositely directed planar faces (63, 64) of the copper phase plates (62). The three diodes (70) in each plane are connected by an additional copper plate (78, 80) which forms an output.

7 Claims, 3 Drawing Sheets

ROTATING RECTIFIER IN BRAZED ASSEMBLY

FIELD OF THE INVENTION

This invention relates to a dynamoelectric machine and, more particularly, to a rotating rectifier assembly therefor.

BACKGROUND OF THE INVENTION

In one known form, a dynamoelectric machine comprises a generator for use in aircraft. Such a generator may include a main generator, a rotating rectifier bridge assembly, an exciter and a permanent magnet generator (PMG). Each of the main generator, exciter and PMG include a rotor driven via a common shaft. The PMG is a pilot generator used to develop output power which is rectified to provide excitation to an exciter stator winding. The exciter rotor carries a three phase ac armature winding connected through the rotating rectifier assembly to a dc field winding of the main generator to develop three phase output power in a stator armature winding A typical rotating bridge rectifier assembly is illustrated in Troscinski U.S. Pat. No. 4,628,219. This rectifier assembly includes a tubular housing receiving a stack of plates sandwiching diode wafers. Because of the sandwiching structure, the housing must be of a sufficient length to accommodate the same. This requirement is in conflict with the need to minimize the size and weight of components in an aircraft. Further, such a device can be difficult to assemble.

One alternative form of a rotating rectifier assembly is illustrated in Trommer U.S. Pat. No. 4,570,094 which discloses the diode wafers being angularly spaced in two parallel planes. The diodes are sandwiched between conductor plates which are held under compression by a biasing device to assure good electrical contact between the various components while occupying a minimum space and minimizing the overall weight of the assembly. Thus, this device relies on clamping forces in order to maintain electrical contact. Further, such a device can be difficult to assemble.

The present invention is directed to overcoming one or more of the problems as set forth above.

SUMMARY OF THE INVENTION

In accordance with the present invention, a rectifier assembly is provided with brazing means for rigidly securing diode wafers to conductive plates Broadly, there is disclosed herein a rectifier assembly including a plurality of conductive phase plates each having opposite surfaces Insulating means mount the conductive phase plates in a plane and angularly spaced about a central axis. A plurality of diodes are provided, two for each such conductive phase plate. Brazing means rigidly secure each of the diode wafers to one of the surfaces or one of the conductive plates, whereby the diode wafers are located in opposite first and second planes. First and second conductive output plates are brazed to the diode wafers in the respective first and second planes. Input terminal means are provided for electrically connecting each phase plate to a respective phase of an AC input source. Output terminal means are provided for electrically connecting each output plate to a point of use.

In accordance with one aspect of the invention, the input terminal means comprise a plurality of ferrules each brazed to one of the phase plates and a flexible connector crimped to each of the ferrules According to another aspect of the invention the output terminal means comprises first and second ferrules brazed to the respective first and second output plates and a flexible conductor crimped to each of the ferrules.

In accordance with another aspect of the invention, the rotating rectifier assembly is provided for a dynamoelectric machine operable to rectify three phase ac power to dc power. The assembly comprises three conductive phase plates, one for each phase, each having opposite surfaces. Insulated means mount the conductive phase plates in a plane and equally, angularly spaced about a central axis. Six diode wafers are provided, two for each phase. Brazing means rigidly secure two of the diode wafers to each of the phase plates on the opposite surfaces thereof, whereby the diode wafers are located in opposite first and second planes. First and second conductive output plates are provided along with brazing means for rigidly securing the first output plate to the three diode wafers in the first plane and the second output plates to the three diode wafers in the second plane. Input terminal means electrically connect each phase plate to a respective phase of an ac power source, while output terminal means electrically connect each output plate to a point of use.

In accordance with yet a further aspect of the invention, the rotating rectifier assembly includes a rectifier subassembly, a cylindrical housing supporting the rectifier assembly, and input and output terminal means. The rectifier subassembly includes three conductive phase plates, one for each phase, each having opposite surfaces, insulated means mounting the conductive phase plates in a plane and equally, angularly spaced about a central axis, six diode wafers, two for each phase, two of the diode wafers being brazed to each said phase plate on the opposite surfaces thereof, whereby the diode wafers are located in opposite first and second planes, and first and second conductive output plates, the first output plate being brazed to the three diode wafers in the first plane and the second output plate being brazed to the three diode wafers in the second plane.

Particularly, the rectifier assembly includes three planar, tear-shaped copper phase plates which are equally angularly spaced about an axis in a cylindrical housing. The six diode wafers are arranged in two parallel planes which are perpendicular to the axis. Three diodes in each plane are brazed to one of the oppositely directed planar surfaces of the copper phase plates. The three diodes in each plane are connected by an additional copper plate which forms an output. A crimp joint is used to provide a flexible connection from each output plate to the main generator field winding, and a similar crimp joint is used to connect each of the three phase plates to the exciter armature The assembly is held in the housing, which has one closed end, by using a spacer at the opposite end and a Belleville washer held in place with a snap ring Further features and advantages of the invention will readily be apparent from the specification and from the drawings.

DETAILED DESCRIPTION OF THE INVENTION

Figure 1:
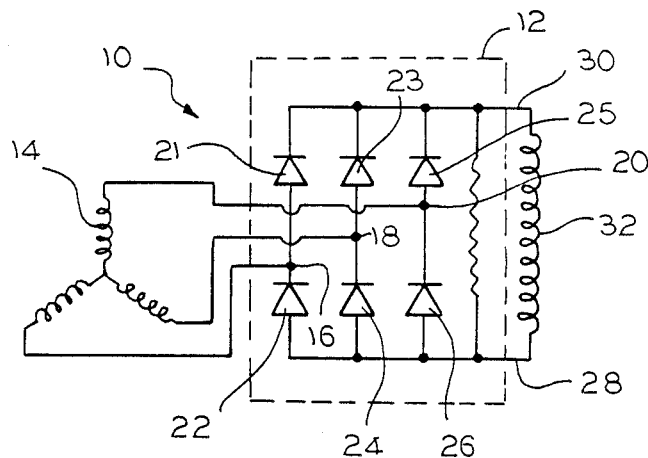
FIG. 1 is a schematic diagram of a rotating rectifier assembly employed in a generator.

With reference to FIG. 1, a schematic diagram illustrates a portion of a brushless generator 10 including a rotating rectifier bridge assembly 12. Although the complete generator 10 is not illustrated herein, such a generator, as discussed above, may include an exciter including a three phase rotor armature winding 14 which develops three phase ac power supplied to junctions 16, 18 and 20 of the rectifier assembly 12. The rectifier assembly 12 includes six diodes 21-26 connected in a bridge configuration to the junctions 16, 18 and 20 to develop dc output power at opposite rails 28 and 30. The dc power is provided to a dc rotor field winding 32 of a main generator (not shown).

Each of the windings 14 and 32 and rectifier assembly 12 are mounted in a rotor in the brushless power generator. The polyphase voltage developed in the exciter armature winding 14, caused by rotation of the rotor is rectified by the rectifier assembly 12 to power the main field winding 32 which is used to develop ac output power, as is well known.

With reference to FIGS. 2-8, there is illustrated a rotating rectifier bridge assembly 40 according to the invention. Specifically, the rectifier assembly 40 is operable to rectify three phase ac power to dc power, as discussed above.

Figure 2:
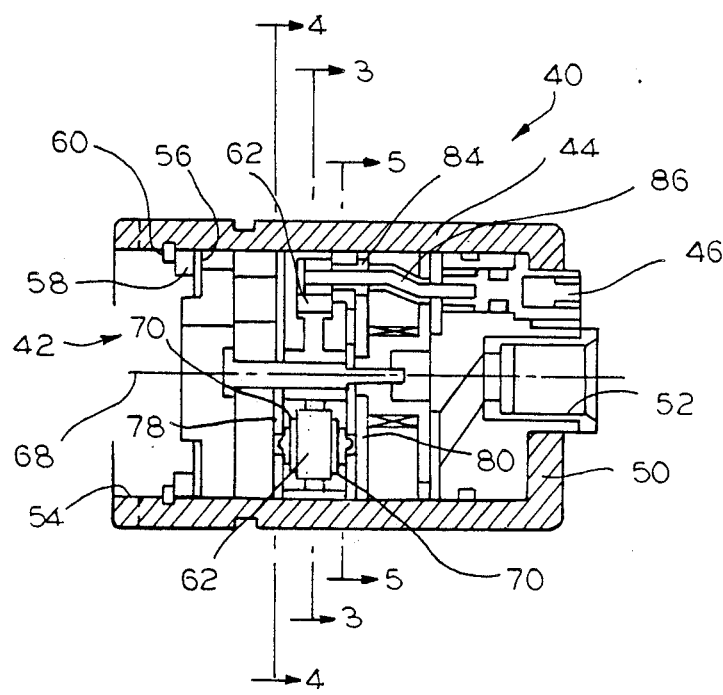
FIG. 2 is an enlarged sectional view of a rectifier assembly according to the invention.
Figure 3:
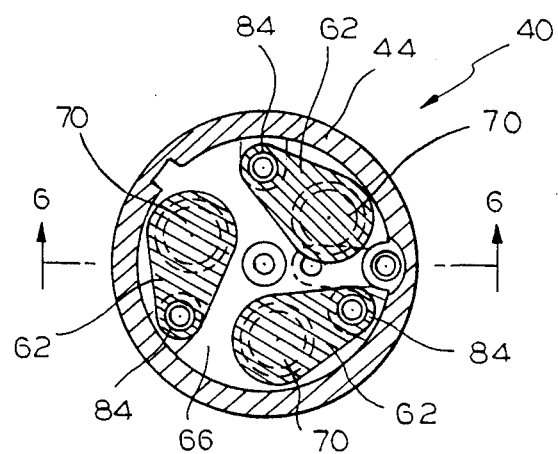
FIG. 3 is a sectional view taken along the line 3—3 of FIG. 2.
Figure 4:
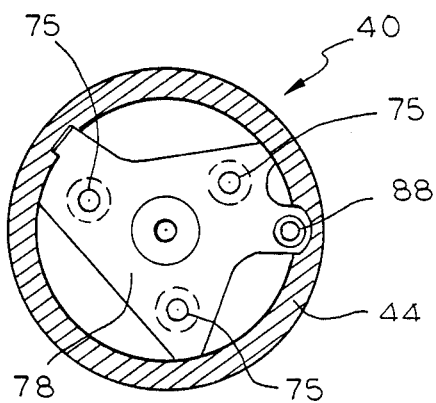
FIG. 4 is a sectional view taken along the line 4—4 of FIG. 2.
Figure 5:
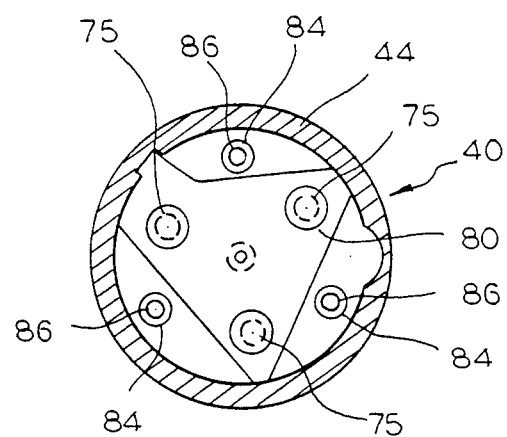
FIG. 5 is a sectional view taken along the line 5—5 of FIG. 2.
Figure 6:
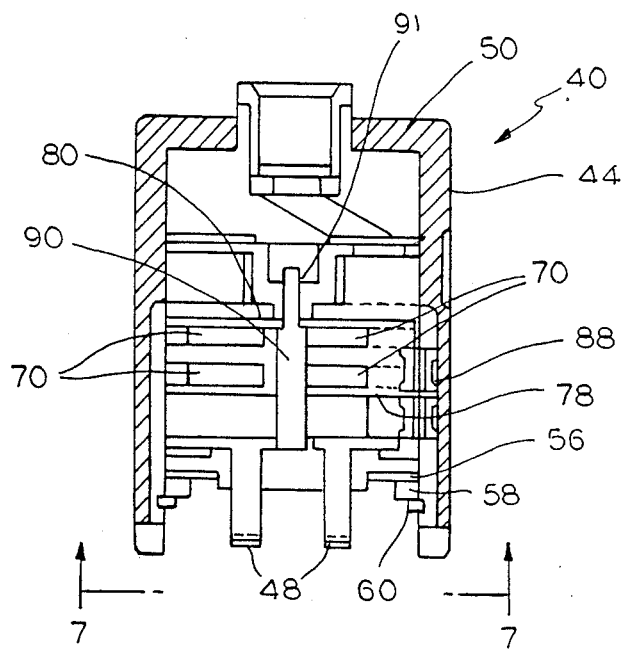
FIG. 6 is a sectional view taken along the line 6—6 of FIG. 3.
Figure 7:
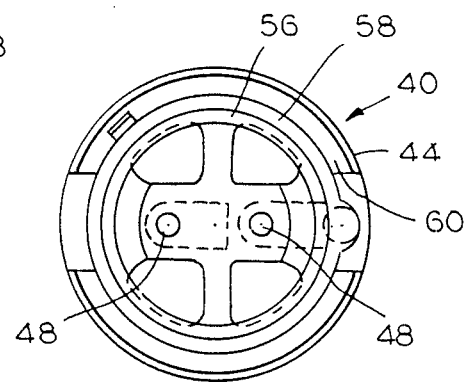
FIG. 7 is an end view taken along the line 7—7 of FIG. 6.

The rectifier assembly 40 includes a rectifier subassembly 42 housed in a tubular, or cylindrical housing 44 and including input terminals 46 extending axially from the housing 44 at one end, see FIG. 2, and output terminals 48, see FIG. 6, extending axially from the housing 44 at an opposite end. The input terminals 46 are used for electrically connecting the subassembly 42 to the respective phases of an ac power source, such as the winding 14, see FIG. 1. Similarly, the output terminals 48 are used for electrically connecting the rectifier subassembly 42 to a point of use, such as the dc field winding 32, see FIG. 1.

The housing 44 includes a closed end 50 through which the input terminals 46 extend. The closed end 50 includes a central port 52 for connection to an oil supply (not shown) used for cooling. Axially opposite the closed end 50 is an axial open end 54 used for inserting the rectifier subassembly 42 therethrough for supporting the same in the housing 44. The subassembly 42 is secured in place using a spring-type washer 56 held in place by an annular spacer 58 and snap ring 60.

Figure 8:
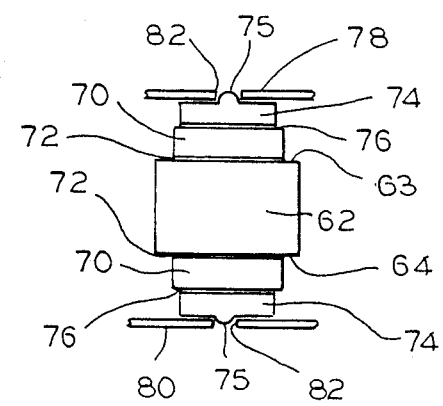
FIG. 8 is a detailed view of a portion of FIG. 2 specifically illustrating brazing connections between components.

The rectifier subassembly 42 includes three tear-shaped copper plates 62, one for each phase, each having opposite surfaces 63 and 64, see FIG. 8. The phase plates 62 represent the junctions 16, 18 and 20, illustrated in FIG. 1. The copper phase plates 62 are supported in the housing 44 using a suitable insulator 66 which maintains the phase plates equally and angularly spaced about an axis, represented by a line 68, of the housing 44. Particularly, the phase plates 62 are spaced 120° apart, as is particularly illustrated in FIG. 3.

Six fusions, or diode wafers, 70 are arranged in two parallel planes which are perpendicular to the axis 68. Specifically, there are three diode wafers 70 in each plane, the three diodes in each plane being brazed, as at 72, see FIG. 8, to opposite sides 63 and 64 of the copper phase plate 62. To facilitate output connections, a contact plate 74 is brazed to each diode wafer 70, as at 76, opposite to the phase plate 62. First and second output plates, 78 (see FIG. 4) and 80 (see FIG. 5) are connected to the three diodes in each plane through the contact plates 74, as by brazing, as at 82, see FIG. 8. Specifically, the output plates 78 and 80 are sized to fit within the housing 44 and yet to span the housing sufficiently to contact each of the three planar contact plates 74. Each contact plate 74 includes a projecting portion 75 which extends through a suitable opening in the output plates 78 and 80 to facilitate connection thereto.

Each of the phase plates 62 includes a crimpable ferrule 84 brazed thereto for connection to one of the input terminals 46. A flexible conductor 86 is crimped to each ferrule 84 and to one of the input terminals 46. The use of flexible conductors 86 facilitates the installation of the rectifier subassembly 42 in the housing 44.

Similarly, a ferrule 88 is brazed to the first output plate 78, see FIG. 6, and the ferrule 88 is connected to one of the output terminals 48. The other output terminal is connected to a central, axial conductive post 90, and is directly connected to the second output plate 80 by brazing as at 91.

Thus, in accordance with the invention, the rectifier subassembly 42 may be prefabricated as by brazing the various parts, as is partially illustrated in FIG. 8. Subsequently, the subassembly 42 is inserted in the housing 44 and secured in place using the snap ring 60. In the event that servicing is necessary, the subassembly 42 can be easily removed and replaced without the need to assemble individual parts in the field.

Further, the use of brazing assures that proper electrical contact is provided which assures efficiency of operation. The disclosed invention is illustrative of the broad inventive concepts comprehended by the invention.

I claim:

1. A rectifier assembly comprising:
   a plurality of conductive phase plates each having opposite surfaces;
   insulated means mounting said conductive phase plates in a plane and angularly spaced about a central axis;
   a plurality of diode wafers, two for each said conductive phase plate;
   brazing means for rigidly securing each said diode wafer to one of the surfaces of one of the conductive plates, whereby said diode wafers are located in opposite first and second planes;
   first and second conductive output plates;
   brazing means for rigidly securing said first output plate to the diode wafers in said first plane and said second output plate to the diode wafers in said second plane;
   input terminal means for electrically connecting each said phase plate to a respective phase of an ac input source; and
   output terminal means for electrically connecting each said output plate to a point of use.

2. The rectifier assembly of claim 1 wherein said input terminal means comprises a plurality of ferrules each brazed to one of said phase plates and a flexible conductor crimped to each said ferrule.

3. The rectifier assembly of claim 1 wherein said output terminal means comprises first and second ferrules brazed to said respective first and second output plates and a flexible conductor crimped to each said ferrule.

4. A rotating rectifier assembly for a dynamoelectric machine operable to rectify three phase ac power to dc power, comprising:
   three conductive phase plates, one for each phase, each having opposite surfaces;
   insulated means mounting said conductive phase plates in a plane and equally, angularly spaced about a central axis;
   six diode wafers, two for each phase;
   brazing means for rigidly securing two said diode wafers to each said phase plate on the opposite surfaces thereof, whereby said diode wafers are located in opposite first and second planes;
   first and second conductive output plates;
   brazing means for rigidly securing said first output plate to the three diode wafers in said first plane and said second output plate to the three diode wafers in said second plane;
   input terminal means for electrically connecting each said phase plate to a respective phase of an ac power source; and
   output terminal means for electrically connecting each said output plate to a point of use.

5. The rotating rectifier assembly of claim 4 wherein said input terminal means comprises a plurality of ferrules each brazed to one of said phase plates and a flexible conductor crimped to each said ferrule.

6. The rotating rectifier assembly of claim 4 wherein said output terminal means comprises first and second ferrules brazed to said respective first and second output plates and a flexible conductor crimped to each said ferrule.

7. A rotating rectifier assembly for rectifying three phase ac power to dc power, comprising:
   a rectifier subassembly including three conductive phase plates, one for each phase, each having opposite surfaces, insulated means mounting said conductive phase plates in a plane and equally, angularly spaced about a central axis, six diode wafers, two for each phase, two of said diode wafers being brazed to each said phase plate on the opposite surfaces thereof, whereby said diode wafers are located in opposite first and second planes, and first and second conductive output plates, said first output plate being brazed to the three diode wafers in said first plane and said second output plate being brazed to the three diode wafers in said second plane;
   a cylindrical housing supporting said rectifier subassembly;
   input terminal means extending axially from said housing for electrically connecting each said phase plate to a respective phase of an ac power source; and
   output terminal means extending axially from said housing for electrically connecting each said output plate to a point of use.

* * * * *